United States Patent [19]
Takahashi

[11] Patent Number: 5,304,832
[45] Date of Patent: Apr. 19, 1994

[54] VERTICAL POWER FIELD EFFECT TRANSISTOR HAVING BASE REGION INWARDLY PROJECTING FROM CORNERS THEREOF INTO SOURCE REGION

[75] Inventor: Mitsuasa Takahashi, Tokyo, Japan

[73] Assignee: NEC Corporation, Tokyo, Japan

[21] Appl. No.: 27,903

[22] Filed: Mar. 8, 1993

[30] Foreign Application Priority Data

Mar. 9, 1992 [JP] Japan ................................. 4-050202

[51] Int. Cl.[5] ...................... H01L 29/10; H01L 29/06
[52] U.S. Cl. ....................................... 257/342; 257/653
[58] Field of Search ................................. 257/342, 653

[56] References Cited
FOREIGN PATENT DOCUMENTS 0163372 7/1987 Japan ................................. 257/342
0238173 9/1989 Japan ................................. 257/342

Primary Examiner—Mark V. Prenty
Attorney, Agent, or Firm—Foley & Lardner

[57] ABSTRACT

A vertical power field effect transistor is liable to be destroyed due to a large amount of current backwardly flowing from the drain region through the base region into the source region when a parasitic bipolar transistor fabricated therefrom turns on, and base contacts radially and inwardly project from the four corners a rectangular base region into a rectangular source region so that the resistance of the base region is decreased, thereby effectively preventing the parasitic bipolar transistor from turn-on.

2 Claims, 10 Drawing Sheets

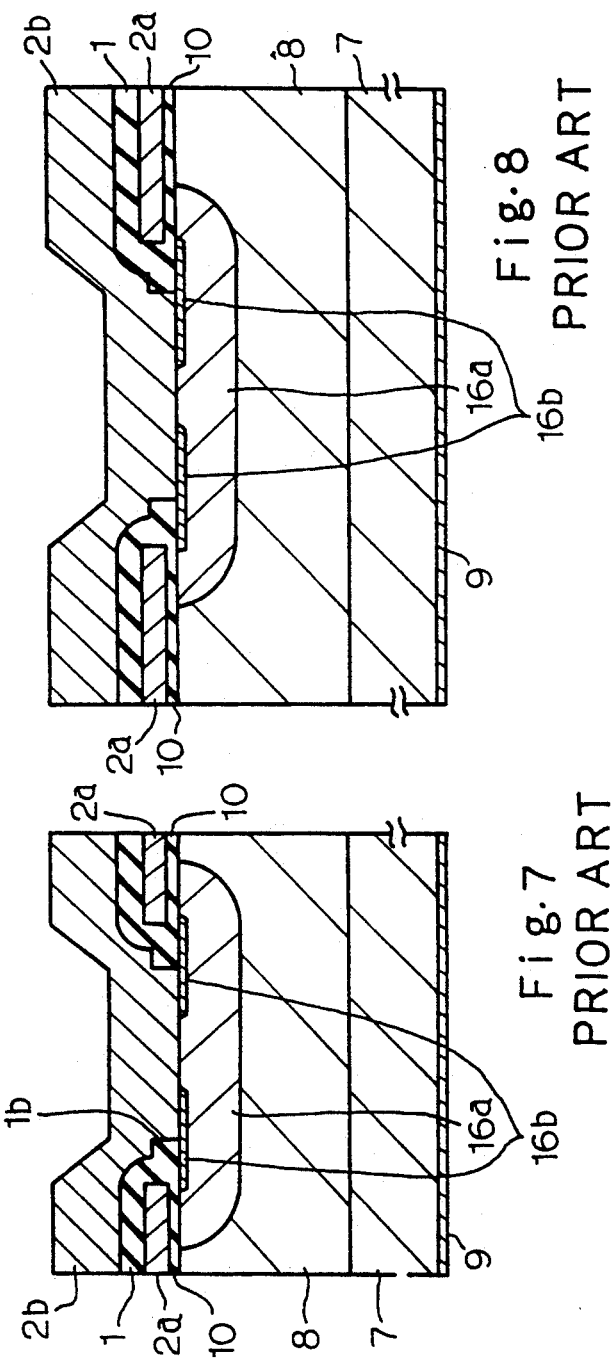

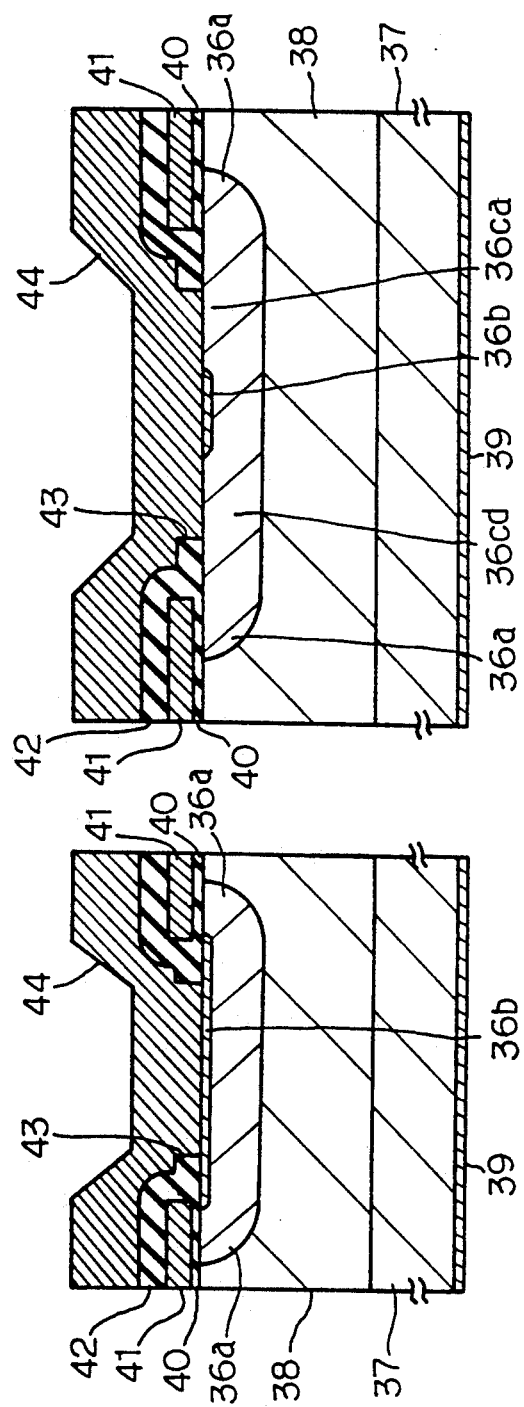

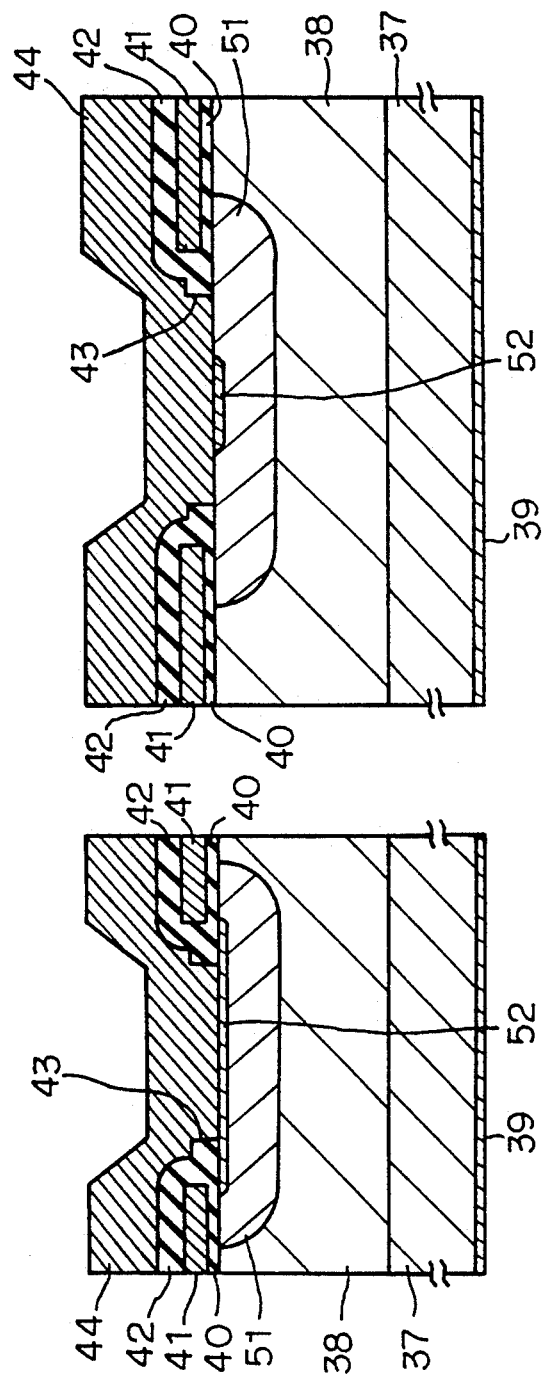

VERTICAL POWER FIELD EFFECT TRANSISTOR HAVING BASE REGION INWARDLY PROJECTING FROM CORNERS THEREOF INTO SOURCE REGION

FIELD OF THE INVENTION

This invention relates to a vertical power field effect transistor and, more particularly, to a vertical power field effect transistor well resistive against large surge voltage between the source region and the drain region.

DESCRIPTION OF THE RELATED ART

A vertical field effect transistor array achieves switching action and/or amplification on, for example, power voltage, and FIG. 1 illustrates the layout of the prior art vertical field effect transistor array. Although the vertical field effect transistor array is covered with an inter-level insulating film 1 as shown in FIGS. 2 and 3, the inter-level insulating film 1, a gate electrode 2a and a source electrode 2b are removed from the structure shown in FIG. 1 for better understanding of the layout.

The prior art vertical field effect transistor array is implemented by a plurality of vertical power field effect transistors 3, 4, 5 and 6, and the vertical power field effect transistors 3 to 6 are fabricated on a single heavily doped n-type silicon substrate 7. A lightly doped n-type epitaxial silicon layer 8 is grown on the heavily doped n-type silicon substrate 7, and the lightly doped epitaxial silicon layer 8 and the heavily doped n-type silicon substrate 7 serve as a common drain region of the vertical power field effect transistors 3 to 6. A common drain electrode 9 is provided on the reverse surface of the heavily doped n-type silicon substrate 7.

In the major surface portion of the epitaxial silicon layer 8 are formed generally rectangular p-type base regions 3a, 4a, 5a, and 6a where heavily doped n-type loop-shaped source regions 3b, 4b, 5b and 6b are respectively nested. Each of the p-type base regions 3a to 6a draws arcs at the four corners thereof, and the side surface of each p-type base region 3a, 4a, 5a or 6a is also curved as will be better seen from FIGS. 2 and 3. Each of the heavily doped loop-shaped source regions 3b to 6b also has a generally rectangular outer boundary, and shallower than the associated p-type base region 3a to 6a. However, the four corners of the outer boundary of each heavily doped n-type source region 3b to 6b are sharper than the four corners of the associated p-type base region 3a to 6a.

Thin gate oxide films 10 cover the peripheral areas of the p-type base regions 3a to 6a as well as the peripheral areas of the heavily doped n-type source regions 3b to 6b, and the gate electrode 2a is overlapped with the thin gate oxide films 10. The gate electrode 2a is covered with the inter-level insulating film 1, and contact holes 1b are formed in the inter-level insulating film 1 in such a manner as to expose parts of the heavily doped n-type source regions 3b to 6b and the contact areas 3c, 4c, 5c and 6c of the p-type base regions 3a to 6a inside the heavily doped loop shaped n-type source regions 3b to 6b. The source electrode 2b is formed on the inter-level insulating film 1, and is held in contact with the parts of the heavily doped n-type source regions 3b to 6b as well as the contact areas 3c to 6c.

The vertical field effect transistor array is fabricated through a process sequence, and the process sequence starts with preparation of the heavily doped n-type silicon substrate 7. The lightly doped silicon layer 8 is epitaxially grown on the heavily doped n-type silicon substrate 7. The gate oxide films 10 are thermally grown on the major surface of the lightly doped n-type epitaxial layer 8, and a polysilicon film is deposited over the entire surface. The polysilicon film is doped with phosphorus atoms for regulating the sheet resistance to 11 ohms per square, and the doped polysilicon film is, then, patterned through a lithographic process to the gate electrode 2. Boron atoms are ion implanted into the lightly doped n-type epitaxial layer 8, and are diffused thereinto through a driving stage for forming the p-type base regions 3a to 6a. An appropriate mask is formed through the lithographic process, and phosphorus atoms or arsenic atoms are ion implanted through the mask layer into the p-type base regions 3a to 6a. The n-type impurity atoms are driven with heat, and form the heavily doped loop-shaped n-type source regions 3b to 6b. The interlevel insulating film 1 is deposited over the entire surface of the structure, and the contact holes 1b are formed in the inter-level insulating film 1 through the lithographic process. An appropriate conductive substance is deposited over the entire surface, and is patterned to the source electrode 2b. Finally, the drain electrode 9 is deposited on the reverse surface of the heavily doped n-type silicon substrate 7.

The vertical field effect transistor array thus arranged is incorporated in an electric system, and is switched for controlling power voltage. Namely, when high voltage level is applied to the gate electrode 2, the heavily doped loop-shaped n-type source regions 3b to 6b are electrically conducted with the lightly doped epitaxial silicon layer 8 and, accordingly, with the drain electrode 9, and the vertical power field effect transistors 3 to 6 concurrently turn on, thereby allowing a large amount of current to flow between the drain electrode 9 and the heavily doped loop-shaped n-type source regions 3b to 6b. However, if the high voltage level is removed from the gate electrode 2, the heavily doped loop-shaped n-type source regions 3b to 6b are electrically isolated from the drain electrode 9.

Thus, the vertical field effect transistor array can effectively control the large amount of current flow. However, a problem is encountered in the prior art vertical field effect transistor array in that the vertical power field effect transistors 3 to 6 are liable to be damaged due to parasitic bipolar transistors. In detail, the heavily doped n-type source regions 3b to 6b, the peripheral portions of the p-type base regions 3a to 6a and the epitaxial silicon layer 8 serve as emitters, bases and a common collector, respectively, and form the parasitic bipolar transistors. As shown in FIG. 4, p-type impurity atoms represented by dots are outwardly diffused from the boundary of diffusion window 11 as indicated by arrows in the diffusion stage for the p-type base regions 3a to 6a, and the diffusion source represented by the dot 11a covers relatively wide area rather than the other diffusion sources 11b. As a result, the diffusion range of the source 11a is narrower than those of the other sources 11b, and the corners of the p-type base regions 3a to 6a draw arcs indicated by the real line rather than a broken line. Moreover, the corners are shallower and lower in impurity concentration than the other portions along straight edges 12. This results in large current amplification factor $h_{fe}$ of the parasitic bipolar transistors. Since the contact areas 3c to 6c are respectively surrounded by the heavily doped loop-shaped n-type source regions 3b to 6b as shown in FIG. 5, the current flows over long distance at the corners, and the base resistance Rb is larger at the corners than the others.

In these circumstances, if the vertical field effect transistor array is coupled with an inductance, the p-n junctions between the lightly doped epitaxial silicon layer 8 and the p-type base regions 3a to 6a tend to be broken down due to the back electromotive force at the inductance, and the break-down current flows across the p-type base regions 3a to 6a. The break-down current forwardly biases the emitter-base junctions or the p-n junctions between the p-type base regions 3a to 6a and the heavily doped n-type source regions 3b to 6b. As a result, the parasitic bipolar transistors turn on, and the vertical power field effect transistors 3 to 6 are liable to be destroyed due to current concentration.

In other to prevent the vertical power field effect transistors from parasitic bipolar transistors with large current amplification factor, p-type base regions 13a to 16a and heavily doped n-type source regions 13b to 16b are formed in generally octagon, and the corners becomes gentle. The corners of the p-type base regions 13a to 16a are expected not to be so lowered in impurity concentration in order to keep the current amplification factor $h_{fe}$ small. However, the generally octagonal p-type base regions 13a to 16a and the generally octagonal n-type source regions 13b to 16b are less effective against the destruction due to the large amount of current when the parasitic bipolar transistors undesirably turn on.

SUMMARY OF THE INVENTION

It is therefore an important object of the present invention to provide a vertical power field effect transistor which does not allow a parasitic bipolar transistor to turn on.

To accomplish the object, the present invention proposes to decrease the base resistance of a parasitic bipolar transistor.

In accordance with one aspect of the present invention, there is provided a vertical field effect transistor fabricated on a semiconductor substrate structure of a first conductivity type serving as a drain region, comprising: a) a generally rectangular base region formed in a major surface portion of the drain region, and having a second conductivity type opposite to the first conductivity type; b) a generally rectangular source region formed in a surface portion of the generally base region, and having the first conductivity type; c) base contact regions projecting radially inwardly from the four corners of the generally rectangular base region into the generally rectangular source region; d) a gate insulating film covering a surface of the generally rectangular base region between a surface of the drain region and a surface of the generally rectangular source region; e) a gate electrode provided on the gate insulating film; f) a source electrode held in contact with the base contact regions and with the generally rectangular source region; and g) a drain electrode provided on a reverse surface of the semiconductor substrate structure.

In accordance with another aspect of the present invention, there is provided a power transistor implemented by a plurality of vertical field effect transistors arranged in parallel and fabricated on a semiconductor substrate structure of a first conductivity type serving as a common drain region, each of the plurality of vertical field effect transistors comprising: a) a generally rectangular base region formed in a major surface portion of the common drain region, and having a second conductivity type opposite to the first conductivity type; b) a generally rectangular source region formed in a surface portion of the generally base region, and having the first conductivity type; c) base contact regions projecting radially inwardly from the four corners of the generally rectangular base region into the generally rectangular source region; d) a gate insulating film covering a surface of the generally rectangular base region between a surface of the drain region and a surface of the generally rectangular source region; e) a common gate electrode provided on the gate insulating film; f) a common source electrode held in contact with the base contact regions and with the generally rectangular source region; and g) a common drain electrode provided on a reverse surface of the semiconductor substrate structure.

BRIEF DESCRIPTION OF THE DRAWINGS

The features and advantages of the vertical field effect transistor according to the present invention will be more clearly understood from the following description taken in conjunction with the accompanying drawings in which:

FIG. 7 is a cross sectional view taken along line 7—7' of FIG. 6 and showing the structure of the vertical power field effect transistor;

FIG. 8 is a cross sectional view taken along line 8—8' of FIG. 6 and showing the structure of the vertical power field effect transistor;

FIG. 11 is a cross sectional view taken along line 11—11' of FIG. 10 and showing the structure of a vertical power field effect transistor according to the present invention;

FIG. 12 is a cross sectional view taken along line 12—12' of FIG. 10 and showing the structure of the vertical power field effect transistor from a different angle;

FIG. 15 is a cross sectional view taken along line 15—15' of FIG. 14 and showing the structure of a vertical power field effect transistor according to the present invention; and FIG. 16 is a cross sectional view taken along line 16—16' of FIG. 14 and showing the structure of the vertical power field effect transistor from a different angle.

DESCRIPTION OF THE PREFERRED EMBODIMENTS

First Embodiment

Figure 9:
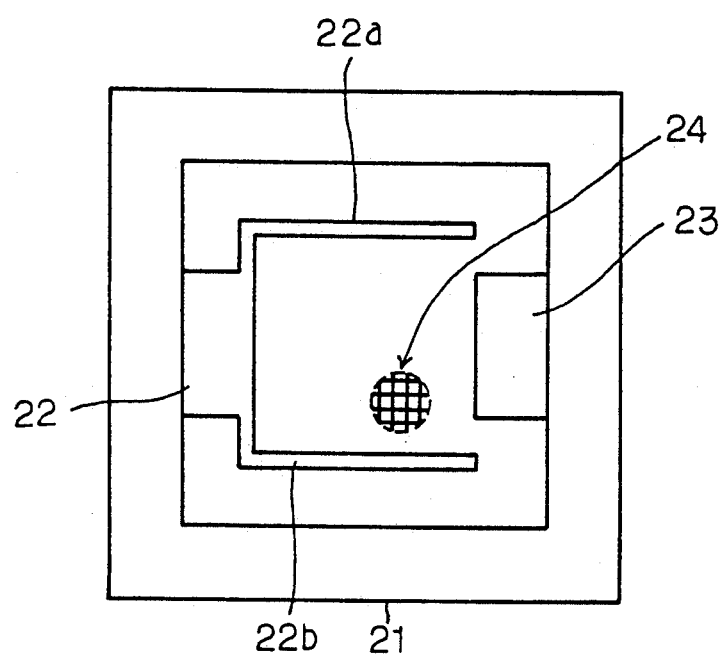
FIG. 9 is a plane view showing the lay out of a vertical field effect transistor array according to the present invention.

Referring to FIG. 9 of the drawings, an array of vertical field effect transistors embodying the present invention is fabricated on a single semiconductor chip 21, and well withstands against 500 volts. A gate pad 22 is provided over the major surface of the semiconductor chip 21, and is bifurcated into gate fingers 22a and 22b. A source pad 23 is opposed to the gate pad 22, and is spaced apart therefrom. Though not shown in FIG. 9, a drain electrode is provided on the reverse surface of the semiconductor chip 21, and a plurality of cells 24 are coupled in parallel between the source pad 23 and the drain electrode. Each of the cells is implemented by a vertical power field effect transistor, and all of the cells 24 or the vertical power field effect transistors are controlled by the gate pad 22 serving as a common gate electrode.

Figure 10:
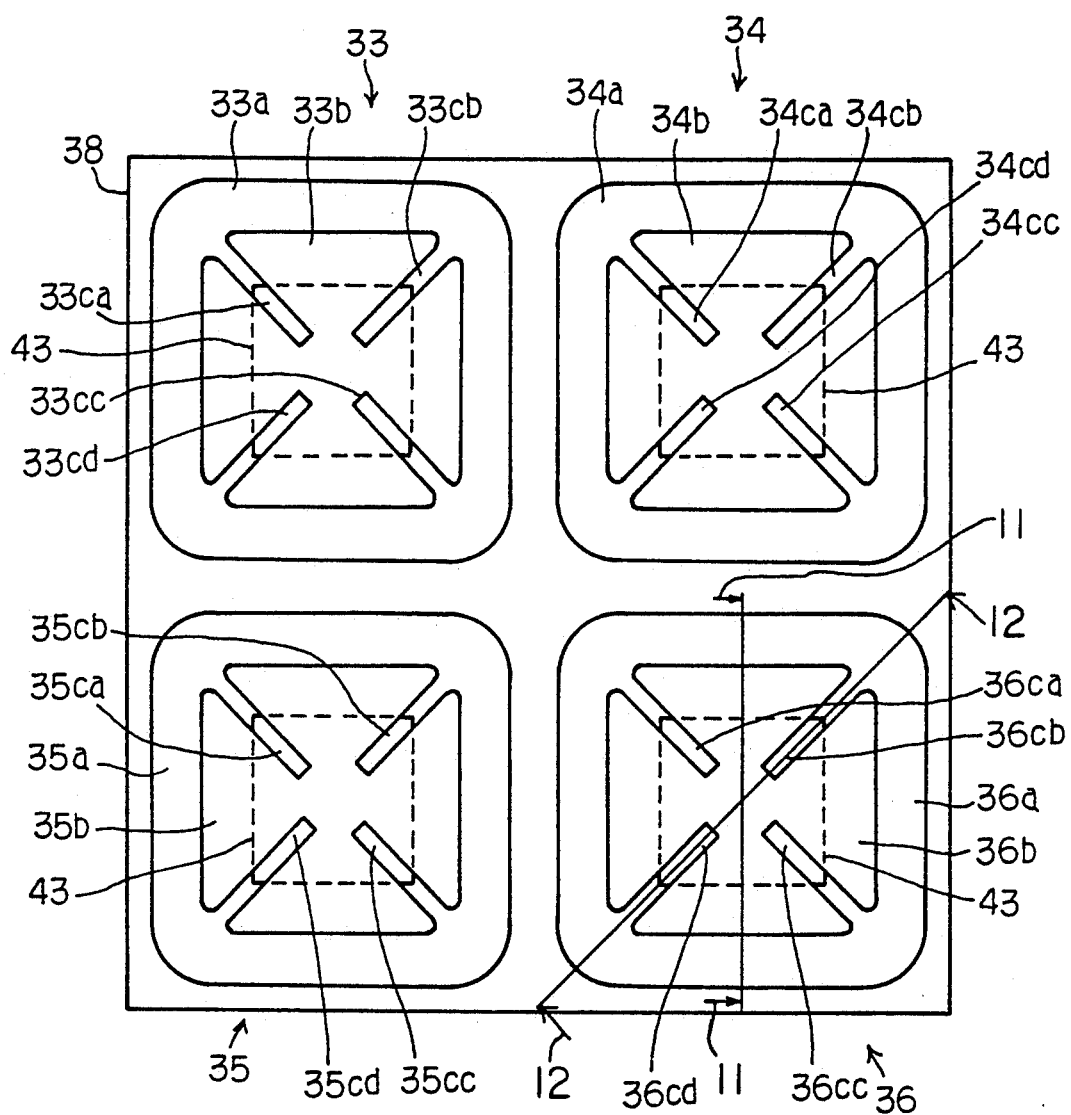
FIG. 10 is a plane view showing the layout of a part of the vertical field effect transistor array according to the present invention.

Turning to FIGS. 10 to 12 of the drawings, the array of vertical field effect transistors is implemented by a plurality of vertical power field effect transistors containing vertical power field effect transistors 33, 34, 35 and 36, and the vertical power field effect transistors 33 to 36 are fabricated on a single heavily doped n-type silicon substrate 37 doped with antimony atoms at $10^{18}$ cm$^{-3}$. A lightly doped n-type epitaxial silicon layer 38 is grown on the heavily doped n-type silicon substrate 37, and the lightly doped epitaxial silicon layer 38 and the heavily doped n-type silicon substrate 37 serve as a common drain region of the vertical power field effect transistors 33 to 36 as well as the semiconductor chip 21. A common drain electrode 39 is provided on the reverse surface of the heavily doped n-type silicon substrate 37, and is mainly composed of silver. In this instance, the epitaxial silicon layer 38 is doped with phosphorus atoms at $2.7\times10^{14}$ cm$^{-3}$, and is grown to thickness of 50 microns.

In the major surface portion of the epitaxial silicon layer 38 are formed generally rectangular p-type base regions 33a, 34a, 35a, and 36a where generally rectangular heavily doped n-type source regions 33b, 34b, 35b and 36b are respectively nested. The p-type base regions 33a to 36a are formed through an ion implantation with boron atoms at dose of $4.9\times10^{13}$ cm$^{-2}$ under acceleration energy of 70 KeV followed by a driving stage at 1140 degrees in centigrade for 165 minutes. The p-type base regions 33a to 36a are as deep as 3.5 microns, and the surface impurity concentration is of the order of $1\times10^{18}$ cm$^{-3}$. Each of the p-type base regions 33a to 36a draws arcs at the four corners thereof, and the side surface of each p-type base region 33a, 34a, 35a or 36a is also curved as will be better seen from FIGS. 11 and 12. The heavily doped n-type source regions 33b to 36b are also formed through an ion implantation of arsenic atoms at dose of $1\times10^{16}$ cm$^{-2}$ under acceleration energy at 70 KeV, and the arsenic atoms are driven at 1000 degrees in centigrade for 30 minutes after removing a mask layer. The heavily doped n-type source regions 33b to 36b are as shallow as 0.3 micron, and the surface impurity concentration is $1\times10^{21}$ cm$^{-3}$.

Four p-type base contact regions 33ca to 33cd, 34ca to 34cd, 35ca to 35cd or 36ca to 36cd radially inwardly project from the four corners of the generally rectangular p-type base region 33a, 34a, 35a or 36a into the associated heavily doped n-type source region 33b, 34b, 35b or 36b; however, the leading ends of the four p-type base contact regions 33ca to 33cd, 34ca to 34cd, 35ca to 35cd or 36ca to 36cd are spaced apart from one another. Each of the p-type base contact regions 33ca to 36cd is 2 microns in width, and the four p-type base contact regions 33ca to 33cd to 36ca to 36cd allow each heavily doped n-type source region 33b to 36b to leave a central area of 4 microns by 4 microns inside the leading edges of the p-type base contact regions. The four p-type base contact regions 33ca to 33cd to 36ca to 36cd are simultaneously formed together with the p-type base regions 33a to 36a by using an appropriate mask. Therefore, each of the heavily doped source regions 33b to 36b is shallower than the associated p-type base region 33a to 36a, and the four p-type base contact regions 33ca to 33cd, 34ca to 34cd, 35ca to 35cd or 36ca to 36cd are as deep as the associated p-type base region 33a, 34a, 35a or 36a. In other words, the heavily doped n-type source regions 33b to 36b float in the associated p-type impurity regions each consisting of the p-type base region and the four base contact regions as shown in FIGS. 11 and 12. In this instance, each of the vertical power field effect transistors 33 to 36 occupies real estate measuring 25 microns by 25 microns.

Thin gate oxide films 40 of 1000 angstroms thick cover the p-type base regions 33a to 36a as well as outer peripheral areas of the respective heavily doped n-type source regions 33b to 36b, and a common gate electrode 41 is overlapped with the thin gate oxide films 40. The common gate electrode 41 is about 6000 angstroms thick, and is patterned from a doped polysilicon film deposited through a low pressure chemical vapor deposition followed by doping stage. After the doping stage, the polysilicon film has about 11 ohms per square. The common gate electrode 41 is electrically conducted with the gate pad 22. The common gate electrode 41 is covered with an interlevel insulating film 42, and is formed of glass doped with phosphorus at 8 moles. The inter-level insulating film 42 is 10,000 angstroms thick, and contact holes 43 are formed in the inter-level insulating film 42 in such a manner as to expose parts of the heavily doped n-type source regions 33b to 36b and leading end portions of the p-type base contact regions 33ca to 33cd, 34ca to 34cd, 35ca to 35cd and 36ca to 36cd. The common gate electrode 41 defines the hollow space occupying 13 microns by 13 microns, and each of the contact holes 43 measures 8 microns by 8 microns in the hollow space. A common source electrode 44 is formed from an aluminum film of 3.5 microns thick on the inter-level insulating film 42, and is held in contact with the parts of the heavily doped n-type source regions 33b to 36b as well as the leading end portions of the p-type base contact regions 33ca to 33cd, 34ca to 34cd, 35ca to 35cd and 36ca to 36cd.

The array of vertical field effect transistors is fabricated through a process sequence similar to that of the prior art except for the masks used in the doping stages for the p-type base regions 33a to 36a and the p-type base contact regions 33ca to 33cd to 36ca to 36cd and for the heavily doped n-type source regions 33b to 36b.

Figure 1:
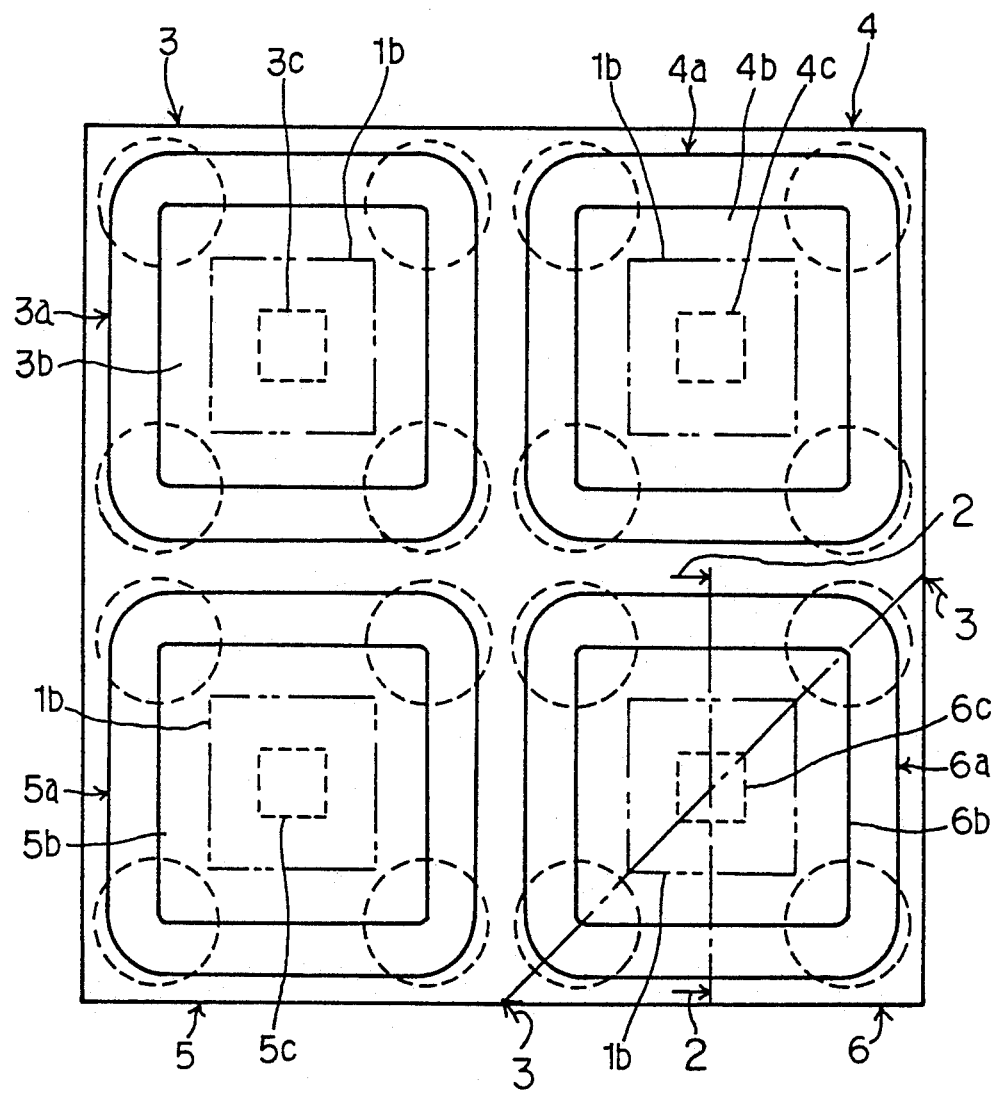
FIG. 1 is a plane view showing the layout of the prior art vertical field effect transistor array.
Figure 3:
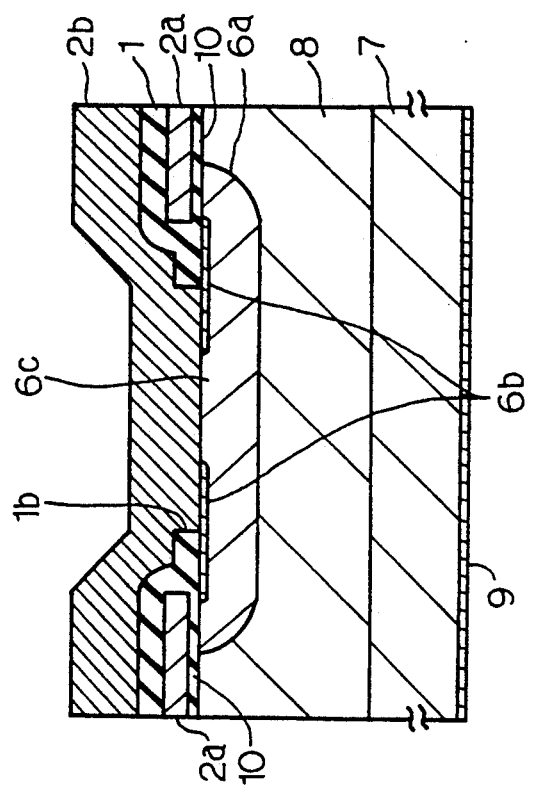
FIG. 3 is a cross sectional view taken along line 3—3' of FIG. 1 and showing the structure of the prior art vertical power field effect transistor.
Figure 2:
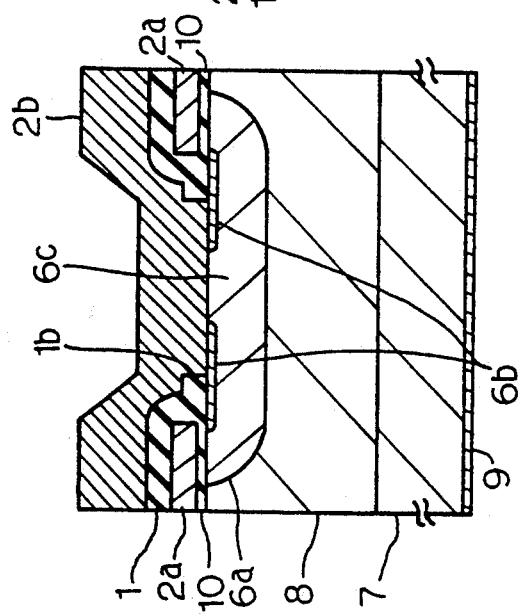
FIG. 2 is a cross sectional view taken along line 2—2' of FIG. 1 and showing the structure of the prior art vertical power field effect transistor.
Figure 4:
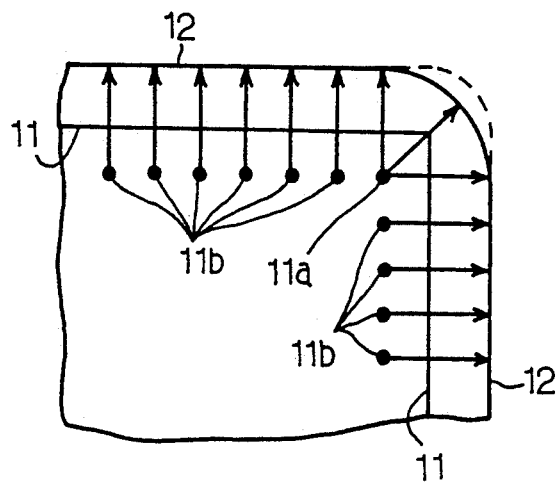
FIG. 4 is a plane view showing each of the corners of the p-type bases encircled in broken lines in FIG. 1 for describing diffusion range of p-type impurity.
Figure 5:
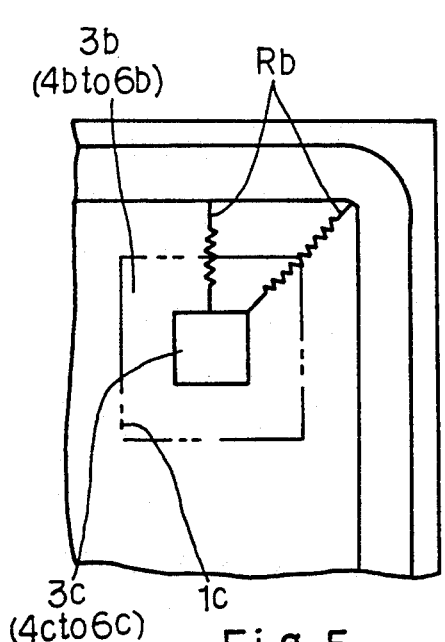
FIG. 5 is a plane view showing the parasitic bipolar transistor of the prior art vertical power field effect transistor.
Figure 13:
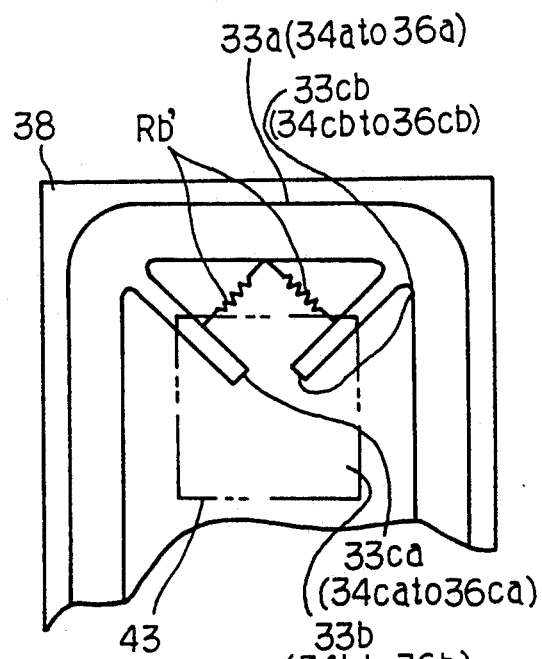
FIG. 13 is a plane view showing a parasitic bipolar transistor produced in the vertical power field effect transistor.
Figure 6:
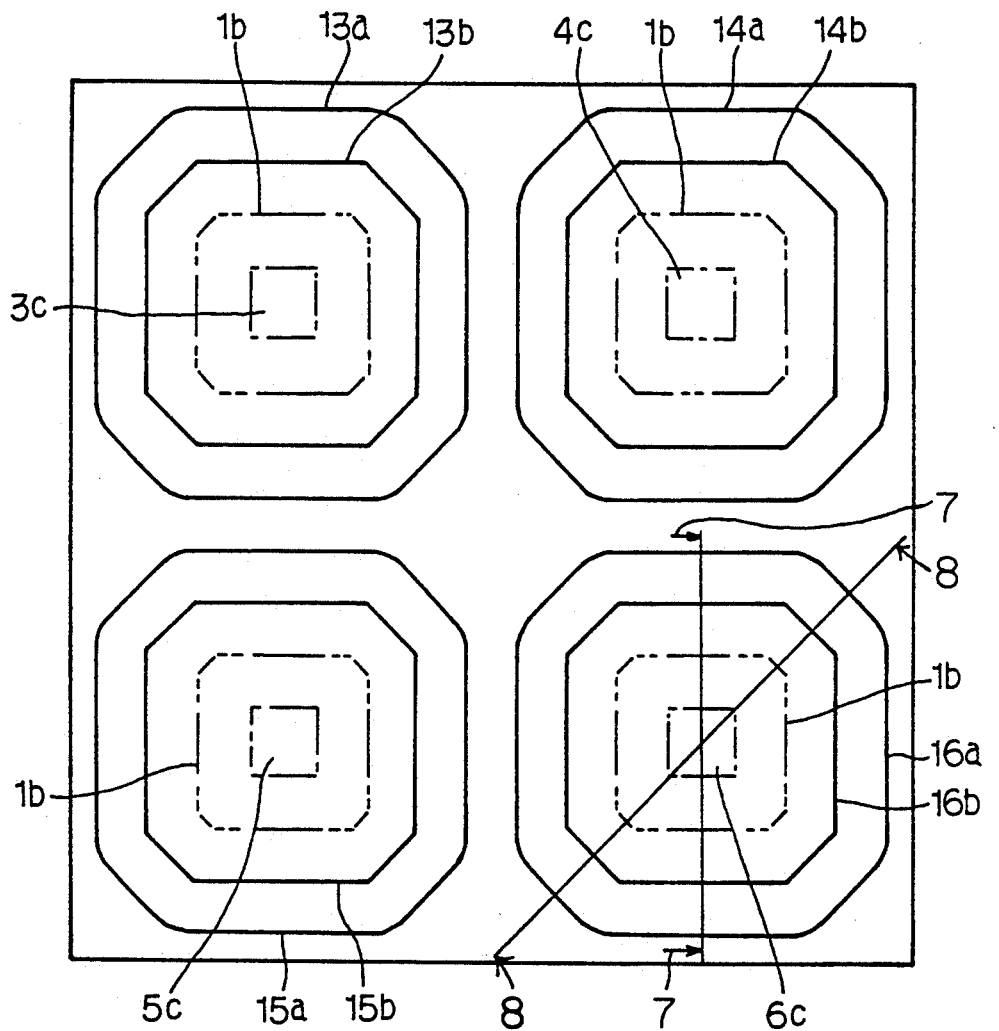
FIG. 6 is a plane view showing the layout of another prior art vertical field effect transistor array.

The vertical power field effect transistor thus arranged behaves as similar to the prior art examples in an ordinary circuit conditions. However, the vertical power field effect transistor is less damaged by a parasitic bipolar transistor. FIG. 13 shows the parasitic bipolar transistor consisting of the lightly doped n-type epitaxial silicon layer 38 serving as a collector, the p-type base region 33a contiguous to the p-type base contact regions 33ca to 33cd serving as a base and the heavily doped n-type source region 33b serving as an emitter. By virtue of the p-type base contact regions 33ca to 33cd, base current path extends from the straight p-n junction between the lightly doped n-type epitaxial layer 38 and the p-type base region 33a and the bottom surface of the heavily doped n-type source region 33b beneath the common source electrode 44, and the base resistance Rb' is smaller than the base resistance Rb of the prior art example. For this reason, the emitter-base forward bias can not be developed, and the parasitic bipolar transistor hardly turns on.

As will be understood from the foregoing description, the vertical power field effect transistor according to the present invention eliminates the corner portions from each source region, and the current amplification factor $h_{fe}$ of the parasitic bipolar transistor is effectively decreased. Moreover, the distance to the portion with large lateral resistance is decreased from 8.5 microns to 5 microns, and the base resistance of the parasitic bipolar transistor is reduced at 40 per cent. This results in that the vertical power field effect transistor according to the present invention increases the withstand capability against the destruction at 40 per cent.

Second Embodiment

Figure 14:
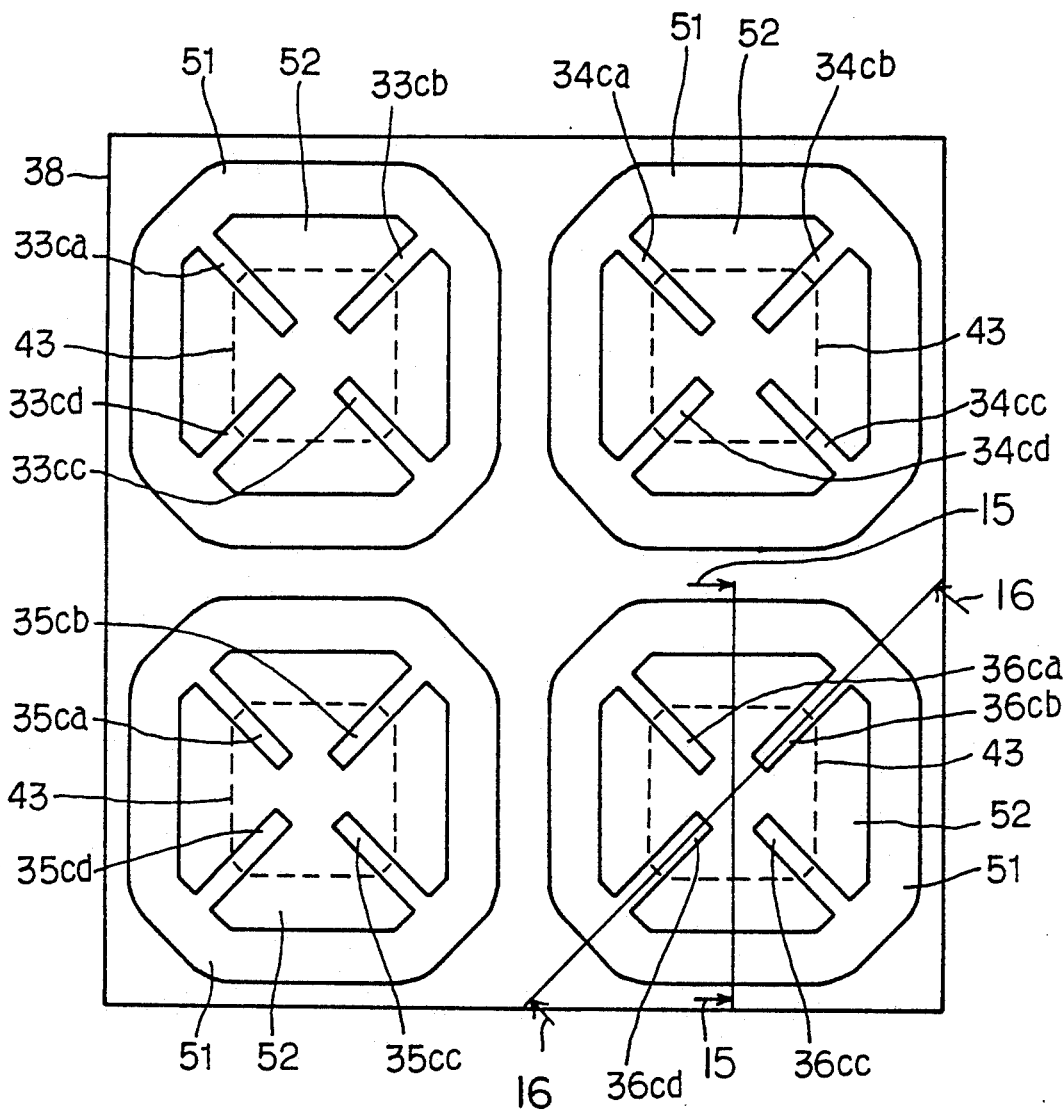
FIG. 14 is a plane view showing the layout of a part of another vertical field effect transistor array according to the present invention.

Turning to FIGS. 14 to 16 of the drawings, another array of vertical field effect transistors embodying the present invention is illustrated. The array of vertical field effect transistors shown in FIGS. 14 to 16 is similar to the first embodiment except for the configuration of each p-type base region 51 and the configuration of each heavily doped n-type source region 52, and, for this reason, the other regions and films are labeled with the same references designating the corresponding regions and films of the first embodiment without any detailed description.

Each p-type base region 51 is shaped into an octagonal configuration, and each heavily doped n-type source region is also octagonal. For this reason, the p-type base regions 51 are homogeneous in dopant concentration rather than the p-type base regions 33a to 36a of the first embodiment.

Although particular embodiments of the present invention have been shown and described, it will be obvious to those skilled in the art that various changes and modifications may be made without departing from the spirit and scope of the present invention. If the conductivity types of the regions and layers are exchanged, a p-channel enhancement type vertical power transistor is fabricated on a silicon substrate. Moreover, base contact regions may be shaped into various configurations in so far as the base contact regions evacuate an source region from the four corners of the base region. Finally, the present invention is effective against undesirable current concentration, and is applicable to any semiconductor device such as, for example, a lateral MOS field effect transistor.

What is claimed is:

1. A vertical field effect transistor fabricated on a semiconductor substrate structure of a first conductivity type serving as a drain region, comprising:
   a) a generally rectangular base region formed in a major surface portion of said drain region, and having a second conductivity type opposite to said first conductivity type;
   b) a generally rectangular source region formed in a surface portion of said generally rectangular base region, and having said first conductivity type;
   c) base contact regions projecting radially inwardly from the four corners of said generally rectangular base region into said generally rectangular source region;
   d) a gate insulating film covering a surface of said generally rectangular base region between a surface of said drain region and a surface of said generally rectangular source region;
   e) a gate electrode provided on said gate insulating film;
   f) a source electrode held in contact with said base contact regions and with said generally rectangular source region; and
   g) a drain electrode provided on a reverse surface of said semiconductor substrate structure.

2. A power transistor implemented by a plurality of vertical field effect transistors arranged in parallel and fabricated on a semiconductor substrate structure of a first conductivity type serving as a common drain region, each of said plurality of vertical field effect transistors comprising:
   a) a generally rectangular base region formed in a major surface portion of said common drain region, and having a second conductivity type opposite to said first conductivity type;
   b) a generally rectangular source region formed in a surface portion of said generally rectangular base region, and having said first conductivity type;
   c) base contact regions projecting radially inwardly from the four corners of said generally rectangular base region into said generally rectangular source region;
   d) a gate insulating film covering a surface of said generally rectangular base region between a surface of said drain region and a surface of said generally rectangular source region;
   e) a common gate electrode provided on said gate insulating film;
   f) a common source electrode held in contact with said base contact regions and with said generally rectangular source region; and
   g) a common drain electrode provided on a reverse surface of said semiconductor substrate structure.

* * * * *